(12) United States Patent
Chen et al.

(10) Patent No.: US 11,139,179 B2
(45) Date of Patent: Oct. 5, 2021

(54) EMBEDDED COMPONENT PACKAGE STRUCTURE AND MANUFACTURING METHOD THEREOF

(71) Applicant: ADVANCED SEMICONDUCTOR ENGINEERING, INC., Kaohsiung (TW)

(72) Inventors: Chien-Fan Chen, Kaohsiung (TW); Yu-Ju Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/565,064

(22) Filed: Sep. 9, 2019

(65) Prior Publication Data

US 2021/0074554 A1     Mar. 11, 2021

(51) Int. Cl.
*H01L 21/56* (2006.01)
*H01L 23/31* (2006.01)
*H01L 23/00* (2006.01)

(52) U.S. Cl.
CPC ........ *H01L 21/568* (2013.01); *H01L 23/3135* (2013.01); *H01L 23/3185* (2013.01); *H01L 24/03* (2013.01); *H01L 24/05* (2013.01); *H01L 24/13* (2013.01); *H01L 2224/024* (2013.01); *H01L 2224/0231* (2013.01); *H01L 2224/02331* (2013.01); *H01L 2224/02371* (2013.01);
(Continued)

(58) Field of Classification Search
CPC ............... H01L 21/568; H01L 23/3185; H01L 23/3135
See application file for complete search history.

(56) References Cited

U.S. PATENT DOCUMENTS 9,391,041 B2    7/2016  Lin
2008/0303136 A1  12/2008  Mori et al.
(Continued)

FOREIGN PATENT DOCUMENTS

JP    2005-332887 A    12/2005
JP    2008-306071 A    12/2008
(Continued)

OTHER PUBLICATIONS

Office Action with English translation for corresponding Japanese Patent Application No. 2019-199479, dated Mar. 2, 2021, 12 pages.
(Continued)

*Primary Examiner* — Anthony Ho
(74) *Attorney, Agent, or Firm* — Foley & Lardner LLP

(57) ABSTRACT

An embedded component package structure including a dielectric structure, a semiconductor chip and a patterned conductive layer is provided. The semiconductor chip is embedded in the dielectric structure, and the dielectric structure encapsulates the semiconductor chip and has a first thickness. The semiconductor chip having a second thickness, and the first thickness is greater than the second thickness, and a ratio of the first thickness to the second thickness is between 1.1 and 28.4. The patterned conductive layer covers an upper surface of the dielectric structure and extending into a first opening of the dielectric structure. The first opening exposes an electrical pad of the semiconductor chip, and the patterned conductive layer is electrically connected to the electrical pad of the semiconductor chip.

21 Claims, 20 Drawing Sheets

(52) U.S. Cl.
CPC .............. *H01L 2224/02381* (2013.01); *H01L 2224/13024* (2013.01)

(56) References Cited

U.S. PATENT DOCUMENTS

| | | |
|---|---|---|
| 2012/0187557 A1 | 7/2012 | Kyozuka et al. |
| 2017/0125373 A1 | 5/2017 | Morita et al. |
| 2018/0061794 A1 | 3/2018 | Kim et al. |

FOREIGN PATENT DOCUMENTS

| | | |
|---|---|---|
| JP | 2012-156251 A | 8/2012 |
| JP | 2015-126121 A | 7/2015 |
| JP | 2018-037629 A | 3/2018 |

OTHER PUBLICATIONS

Decision of Refusal with English translation for corresponding Japanese Patent Application No. 2019-199479, dated Jul. 6, 2021, 11 pages.

EMBEDDED COMPONENT PACKAGE STRUCTURE AND MANUFACTURING METHOD THEREOF

BACKGROUND OF THE INVENTION

Field of the Invention

The invention relates in general to a component package structure and a manufacturing method thereof, and more particularly to an embedded component package structure and a manufacturing method thereof.

Description of the Related Art

In a system-level package structure, a semiconductor embedded in substrate (SESUB) technology that embeds a semiconductor chip into a package substrate has advantages of reduced noise interference upon a package structure as well as reduced a size of product, and has thus become a focus of research and development of manufacturers in the field. To enhance the yield rate of production, it is necessary to fix an embedded component in a dielectric structure to facilitate electrical connection between patterned conductive layers and the embedded component in subsequent process. However, the conventional dielectric structure covering the embedded component is a resin sheet, and the thickness of the resin sheet is at most 80 μm, so that a thicker dielectric structure cannot be provided. In order to ensure that the chip is completely covered by the resin, the chip must to be thinned, but after the chip is thinned, the chip has warpage problem, which makes subsequent processes difficult.

SUMMARY OF THE INVENTION

It is therefore an object of the invention to provide an embedded component package structure and a manufacturing method thereof, in which a conventional resin sheet is replaced by a molding compound material to increase the thickness of the dielectric structure and/or not to reduce the thickness of the semiconductor chip to prevent warpage problem. In addition, in the subsequent opening process, the molding compound material is dry sandblasted to expose the electrical pads of the semiconductor chip.

According to one embodiment of the invention, an embedded component package structure including a dielectric structure, a semiconductor chip and a patterned conductive layer is provided. The semiconductor chip is embedded in the dielectric structure, and the dielectric structure encapsulates the semiconductor chip and has a first thickness. The semiconductor chip having a second thickness, and the first thickness is greater than the second thickness, and a ratio of the first thickness to the second thickness is between 1.1 and 28.4. The patterned conductive layer covers an upper surface of the dielectric structure and extending into a first opening of the dielectric structure. The first opening exposes an electrical pad of the semiconductor chip, and the patterned conductive layer is electrically connected to the electrical pad of the semiconductor chip.

According to another embodiment of the invention, an embedded component package structure including including a dielectric structure, a semiconductor chip and a patterned conductive layer is provided. The dielectric structure is a thermosetting molding compound. The semiconductor chip is embedded in the dielectric structure, and the dielectric structure encapsulates the semiconductor chip. The patterned conductive layer covers an upper surface of the dielectric structure and extending into a first opening of the dielectric structure. The first opening exposes an electrical pad of the semiconductor chip, and the patterned conductive layer is electrically connected to the electrical pad of the semiconductor chip, wherein the first opening is formed by sandblasting.

According to an alternative embodiment of the invention, a method of manufacturing an embedded component package structure is provided, including the following steps. A semiconductor chip is provided on a carrier. A dielectric structure is provided on the carrier to encapsulate the semiconductor chip, and the dielectric structure is thermoformed by a mold. a dry sandblasting is performed on the dielectric structure to form a first opening exposing an electrical pad of the semiconductor chip. A patterned conductive layer is formed on an upper surface of the dielectric structure and extending into the first opening, and the patterned conductive layer is electrically connected to the electrical pad of the semiconductor chip.

Figure 1A:
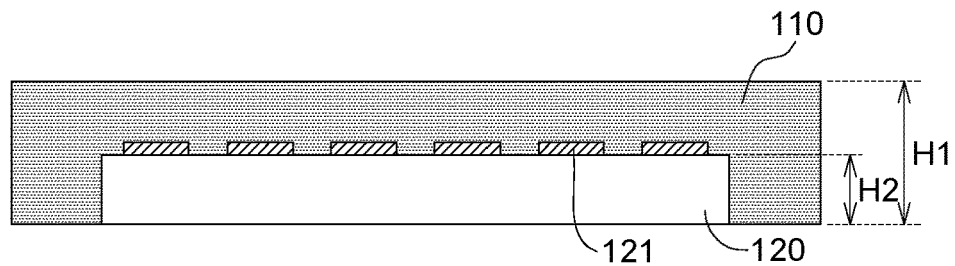
FIGS. 1A to 1D are schematic views showing a method of manufacturing an embedded component package structure according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Details are given in the non-limiting embodiments below. It should be noted that the embodiments are illustrative examples and are not to be construed as limitations to the claimed scope of the present invention. The same/similar denotations are used to represent the same/similar components in the description below. Directional terms such as above, below, left, right, front or back are used in the following embodiments to indicate the directions of the accompanying drawings, not for limiting the present invention.

According to an embodiment of the present invention, an embedded component package structure and a manufacturing method thereof are provided. Referring to FIGS. 1A to 1D, which are schematic diagrams showing a method of manufacturing an embedded component package structure 100 according to an embodiment of the present invention. First, a dielectric structure 110 is formed to encapsulate the semiconductor chip 120. Next, the dielectric structure 110 is dry sandblasted to form a first opening 111 to expose electrical pads 121 of the semiconductor chip 120. Then, a patterned conductive layer 130 is formed on an upper surface 112 of the dielectric structure 110 and extends into the first opening 111, and the patterned conductive layer 130 is electrically connected to the electrical pads 121 of the semiconductor chip 120. In FIG. 1D, the manufacturing method further comprises grinding the back surface 122 of the semiconductor chip 120 to reduce the thickness of the semiconductor chip 120.

Referring to FIG. 1A, the dielectric structure 110 has a first thickness H1, and the semiconductor chip 120 has a second thickness H2. The first thickness H1 is greater than the second thickness H2, and the ratio of the first thickness H1 to the second thickness H2 is between 1.1 and 28.4. In an embodiment, the first thickness H1 is, for example, between 110 and 1420 μm, and the second thickness H2 is, for example, between 100 and 50 μm. The difference between the first thickness H1 and the second thickness H2 is, for example, between 10 and 1370 μm.

The dielectric structure 110 of the present embodiment replaces a conventional resin sheet with an epoxy molding compound (EMC). The main compositions of the resin sheet and EMC are epoxy resin and fillers, but the contents and weight percentages of the fillers are different, so that the characteristics of the resin sheet and EMC will be different. The weight percentage of the fillers of the conventional resin sheet is only 60-85%, and the weight percentage of the fillers of the EMC is more than 85 wt % (such as 87 wt %). Referring to Table 1 and Table 2, the detail description of the characteristics of the EMC are shown.

In an embodiment, since the thickness of the molding compound material (between 110 and 1420 μm) is much larger than the thickness limitation (less than 80 μm) of the resin sheet, the thickness and electrical insulation of the dielectric structure 110 is increased. In addition, the molding compound material is, for example, a thermosetting epoxy resin, which is placed in a mold and thermoformed to encapsulate the semiconductor chip 120, and is not limited to a sheet shape, and may be in liquid or melting state. After the cured molding compound is removed from the mold, the post-mold cure process can be performed on the molding compound in a high temperature environment, so that the molding compound can be completely cured, and the cured molding compound can prevent the semiconductor chip 120 from being warped. Compared with the conventional method, the semiconductor chip is fixed on the carrier with a resin sheet, and the semiconductor chip is encapsulated with another resin sheet, only the molding process is required in present embodiment, and the thickness of the dielectric structure 110 can be greatly increased according to the overall thickness of the package structure 100 to overcome the problem of the thickness limitation of the conventional resin sheet.

Figure 1B:
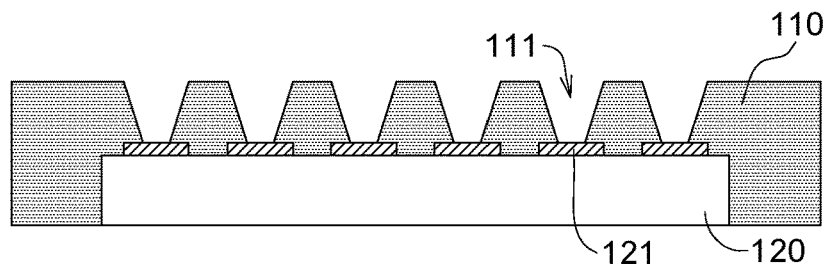

Referring to FIG. 1B, the dielectric structure 110 is dry sandblasted to form a plurality of first openings 111, each of the first openings 111 exposes a corresponding electrical pad 121. The higher the thickness of the dielectric structure 110, the more sandblasting number is required to form a predetermined opening depth. In addition, the size of the electrical pad 121 is preferably less than 60 μm, so that the aperture of the first opening 111 formed by the sandblasting process is preferably less than 40 μm. In addition, after dry sandblasting, the walls of the openings of the dielectric structure 110 may also be subjected to a refined surface treatment to avoid the formation of a granulated rough surface. In an embodiment, a filler (for example, $Al_2O_3/SiO_2$ in Table 2) having a small particle size may be selected and added to the dielectric structure 110, and the particle average size of the filler is, for example, between 5 and 15 μm, preferably between 5 and 10 μm. For the filler exposed by the subsequent sandblasting process, the surface roughness of the wall is not excessively large due to large particle size, which affects the bonding reliability of the subsequent electroless plated seed layer to the molding compound material.

Figure 1C:
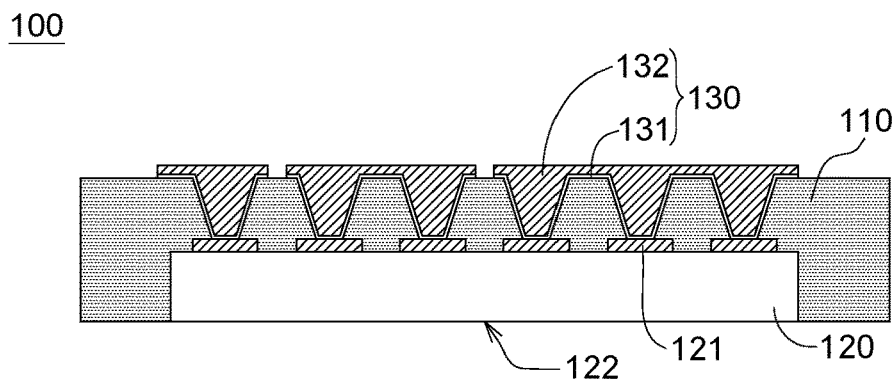
Figure 1D:
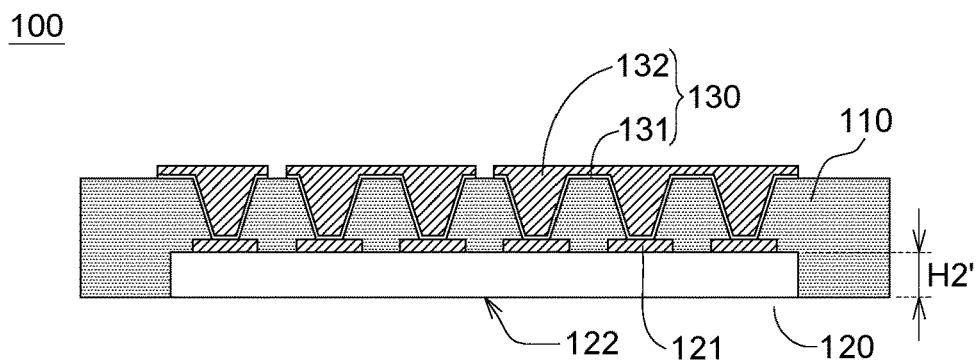

Referring to FIG. 1C, the patterned conductive layer 130 includes, for example, an electroless plated seed layer 131 and an electroplated copper layer 132. The electroplated copper layer 132 may be formed on the electroless plated seed layer 131, and portions of the copper layer 132 and the seed layer 131 are etched to form a patterned conductive layer 130. Referring to FIG. 1C, the lower surface 114 of the dielectric structure 110 can align with the back surface 122 of the semiconductor chip 120, and the back surface 122 of the semiconductor chip 120 is exposed from the dielectric structure 110.

Referring to FIG. 1D, the back surface 122 of the semiconductor chip 120 and a portion of the dielectric structure 110 are ground to reduce the thicknesses of the semiconductor chip 120 and the dielectric structure 110, for example, the thickness of the semiconductor chip 120 is reduced by ⅓ or more. After grounding, the thickness of the semiconductor chip 120 is, for example, between 50 and 100 μm.

Figure 2:
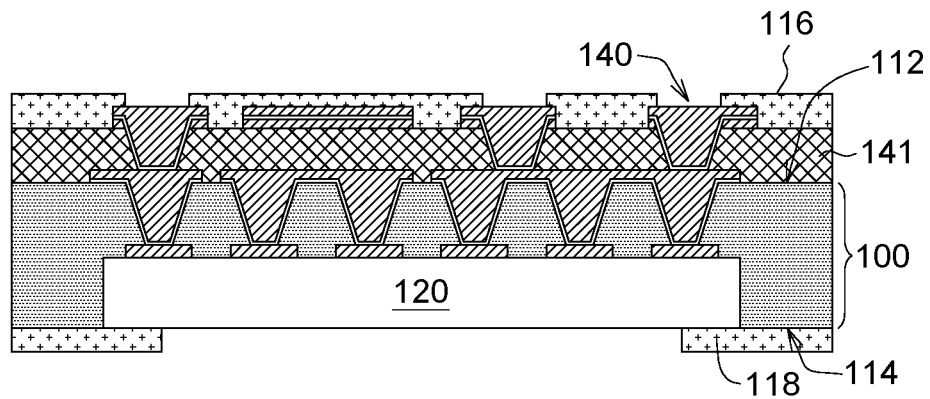
FIGS. 2 to 6 are schematic views of embedded component package structures according to various embodiments of the present invention.

Referring to FIGS. 2 to 6, which respectively show schematic diagrams of an embedded component package structure according to various embodiments of the present invention. Each of the embodiments in FIGS. 2 to 6 has the embedded component package structure 100 of FIG. 1C as a main structure, and further adds other secondary structures according to different requirements. Referring to FIG. 2, the package structure further includes a first circuit structure 140 disposed on the upper surface 112 of the dielectric structure 110, such as a copper clad laminate (CCL). The first circuit structure 140 may include a dielectric layer 141 made of, for example, ABF (Ajinomoto build-up film), pre-impregnated composite fibers, polyimide or polypropylene. For the method of manufacturing the package structure of FIG. 2, please refer to FIGS. 8A to 8L, which will be described later.

Figure 3A:
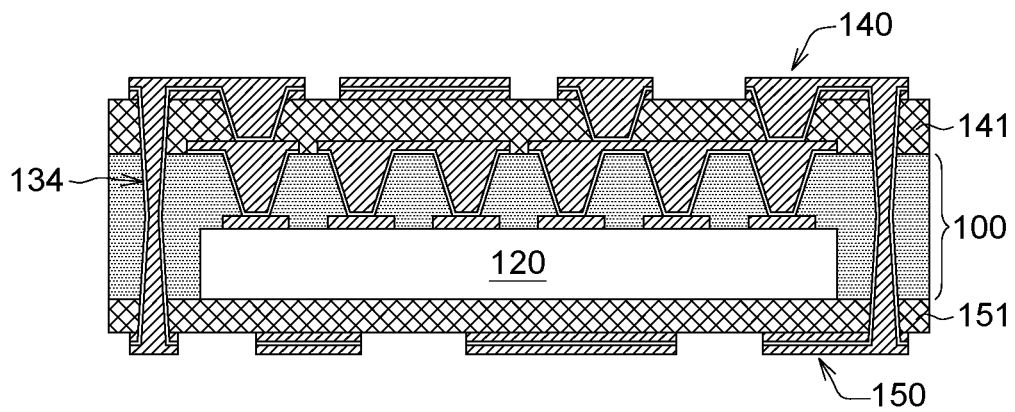
Figure 3B:
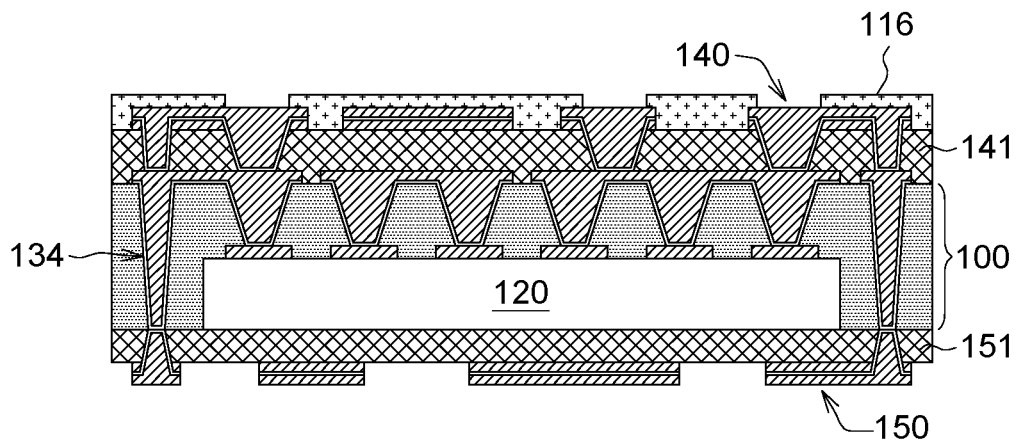

Referring to FIGS. 3A and 3B, the package structure further includes a first circuit structure 140 and a second circuit structure 150. The first circuit structure 140 and the second circuit structure 150 respectively cover the upper surface 112 and the opposite lower surface 114 of the dielectric structure 110, such as a copper clad laminate (CCL). The first circuit structure 140 and the second circuit structure 150 may respectively include a dielectric layer 141 and 151 made of, for example, ABF, pre-impregnated composite fibers, polyimide or polypropylene. For the method of manufacturing the package structure of FIGS. 3A and 3B, please refer to FIGS. 9A to 9L and FIGS. 10A to 10L, which will be described later.

Referring to FIGS. 3A and 3B, the package structure may further include at least one conductive post 134 penetrating through the dielectric structure 110. The conductive post 134 is electrically connected to the first circuit structure 140 and the second circuit structure 150. The method of forming the conductive post 134 includes sandblasting, and the conductive post 134 can be formed together with the processes of the first circuit structure and the second circuit structure.

Figure 4A:
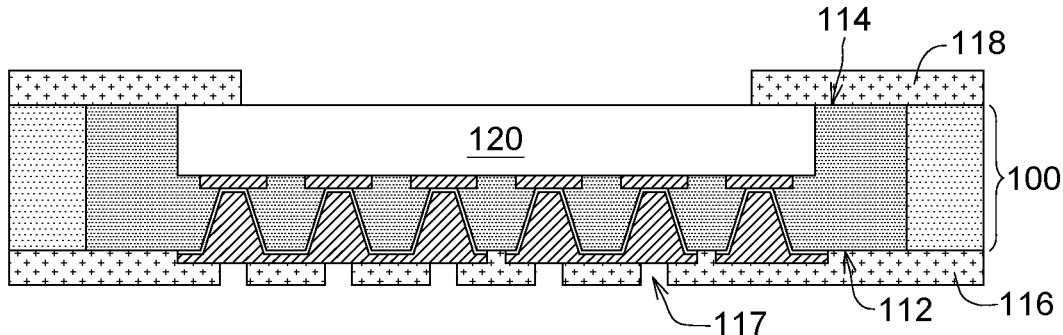
Figure 4B:
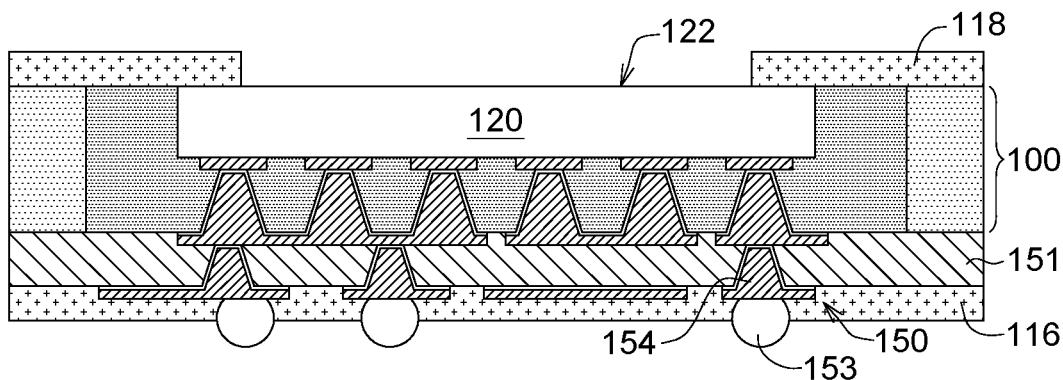

Referring to FIGS. 4A and 4B, the package structure may further include two solder mask layers 116 and 118 to cover the upper surface 112 and the lower surface 114 of the dielectric structure 110, respectively, and the back surface 122 of the semiconductor chip 120 is exposed from the solder mask layer 116. In FIG. 4B, the package structure further includes a circuit structure 150 disposed under the dielectric structure 110, and the solder mask layer 118 under the dielectric structure 110 is used to form solder mask openings to expose the bonding pads 154 so that the solder balls 153 can be electrically connected to the bonding pads 154.

Figure 4C:
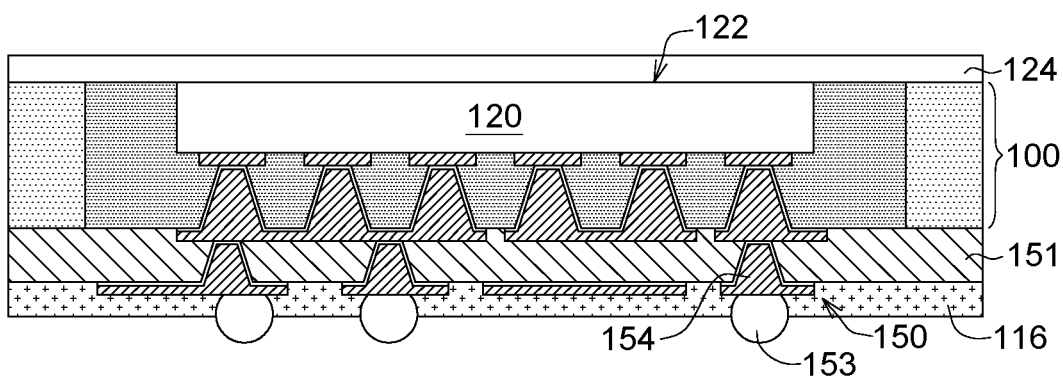

Referring to FIG. 4C, which is similar to the package structure of FIG. 4B. The difference between FIG. 4B and FIG. 4C is that the package structure further includes a heat sink 124 disposed above the dielectric structure 110 and thermally contacting the back surface 122 of the semiconductor chip 120. The heat sink 124 is used to absorb waste heat from the semiconductor chip 120 to lower the temperature of the semiconductor chip 120.

Figure 5A:
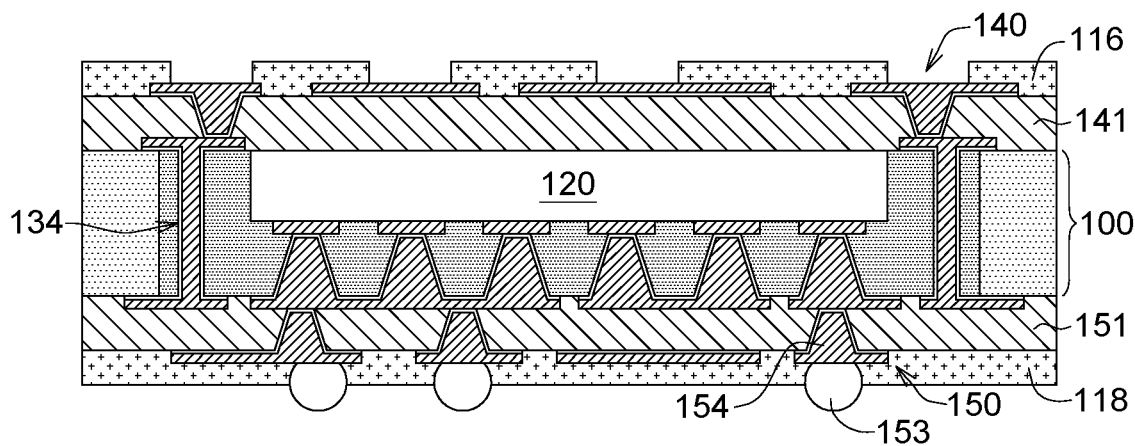
Figure 5B:
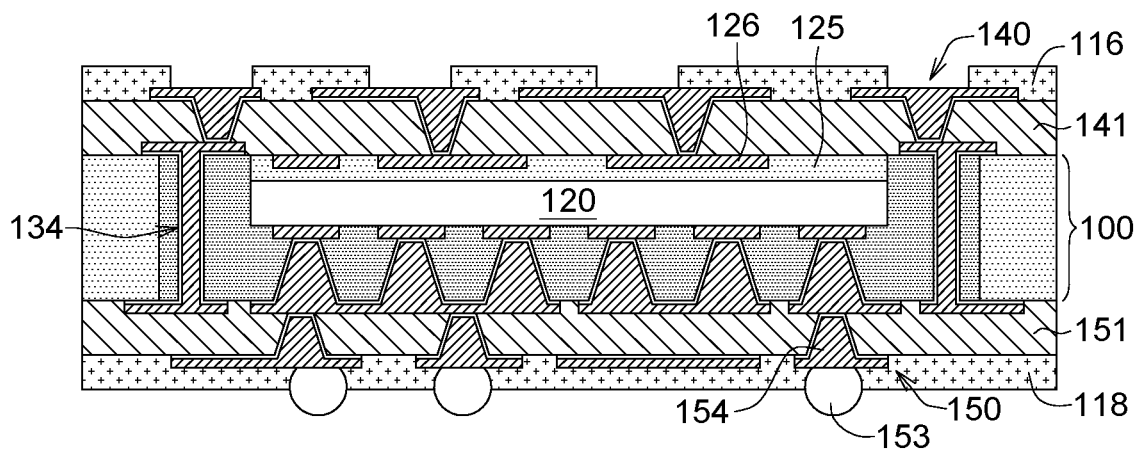

Referring to FIGS. 5A and 5B, which are similar to the package structures of FIGS. 3A and 3B. The difference between FIGS. 5A-5B and FIGS. 3A-3B is that the package structure further includes two solder mask layers 116 and 118 covering on the top and bottom of the first circuit structure 140 and the two-circuit structure 150, the solder mask layer 118 under the dielectric structure 110 is used to form solder mask openings to expose the bonding pads 154 so that the solder balls 153 can be electrically connected to the bonding pads 154. In addition, in FIG. 5B, the semiconductor chip 120 may further include a die attach film 125 and a circuit layer 126 embedded in the die attach film 125. The circuit layer 126 is formed in advance in the die attach film 125 and is exposed from the surface of the dielectric structure 110. The first circuit structure 140 is further formed on the dielectric structure 110 so that the circuit layer 126 can be electrically connected to the first circuit structure 140.

Figure 6:
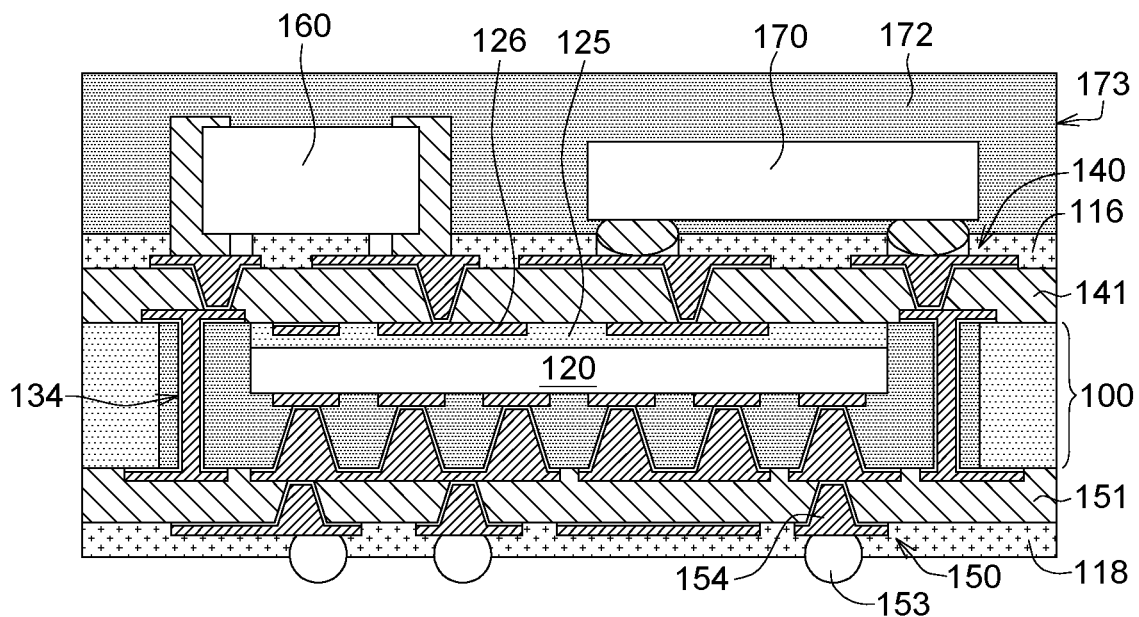

Referring to FIG. 6, which is similar to the package structure of FIG. 5B. The difference between FIG. 5B and FIG. 6 is that the package structure further includes a passive component 160 and an application specific integrated circuit (ASIC) chip 170 disposed on the top of the first circuit structure 140 and electrically connected to the first circuit structure 140 or the circuit layer 126 in the die attach film 125. In an embodiment, the passive component 160 is, for example, a capacitor, an inductor, or a resistor. The ASIC chip 170 can work with the semiconductor chip 120 or operate separately to improve the overall performance of the chip. In addition, the package structure further includes a molding compound 172 encapsulating the passive component 160 and the application specific integrated circuit chip 170, and the side surface 173 of the molding compound 172 may be, for example, aligned with the side of the package structure 100. Referring to Table 1, the main composition of the molding compound 172 is epoxy resin and fillers. The weight percentage of the fillers is 87 or 89 wt %, the average size is 14 or 17 µm, and the sieve size is 55 or 75 µm. Referring to Table 2, the main composition of the dielectric structure 110 is epoxy resin and fillers, except that the weight percentage of the fillers is 89 wt %, the average size is 5 µm, and the sieve size is 25 µm.

Figure 7A:
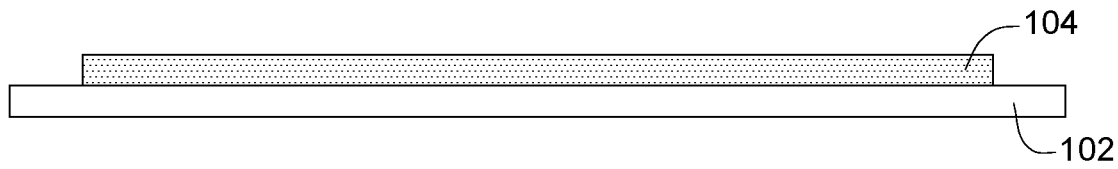
FIGS. 7A to 7I are schematic views showing a method of manufacturing an embedded component package structure according to an embodiment of the present invention.
Figure 7B:
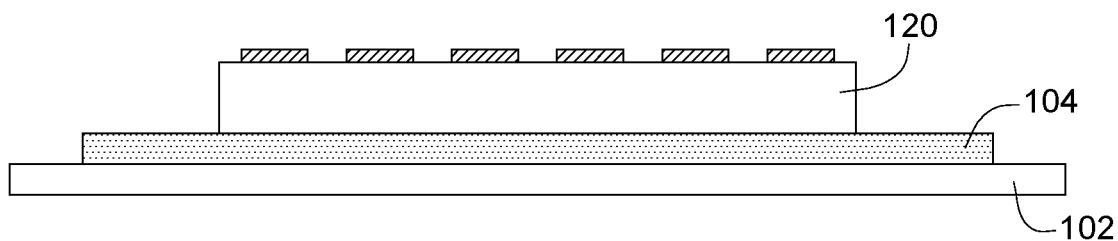
Figure 7C:
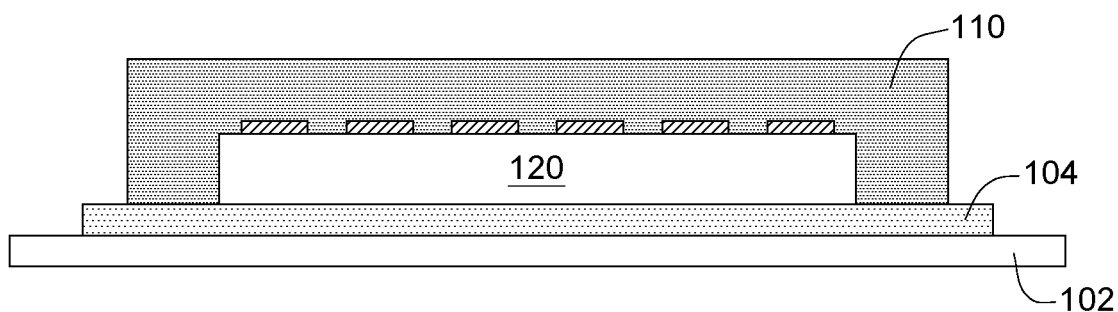
Figure 7D:
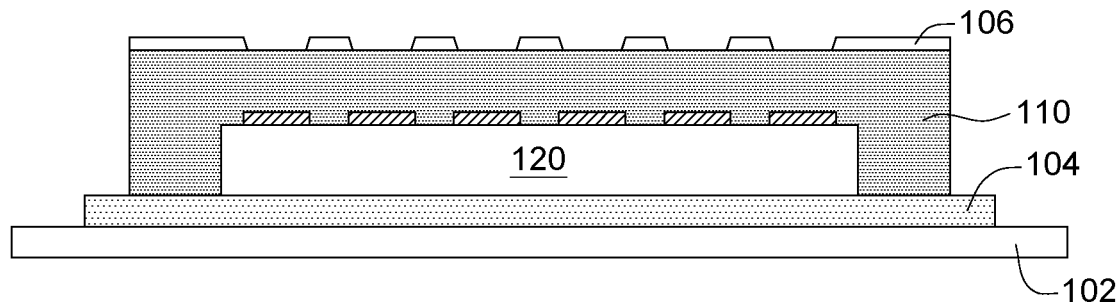
Figure 7E:
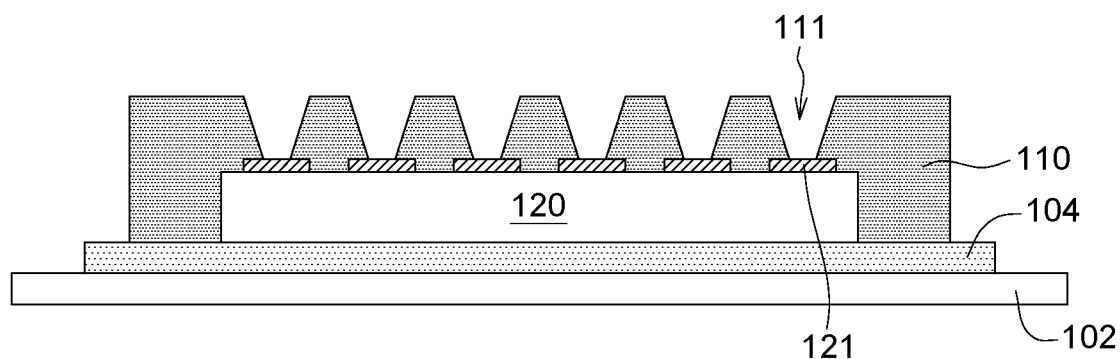
Figure 7F:
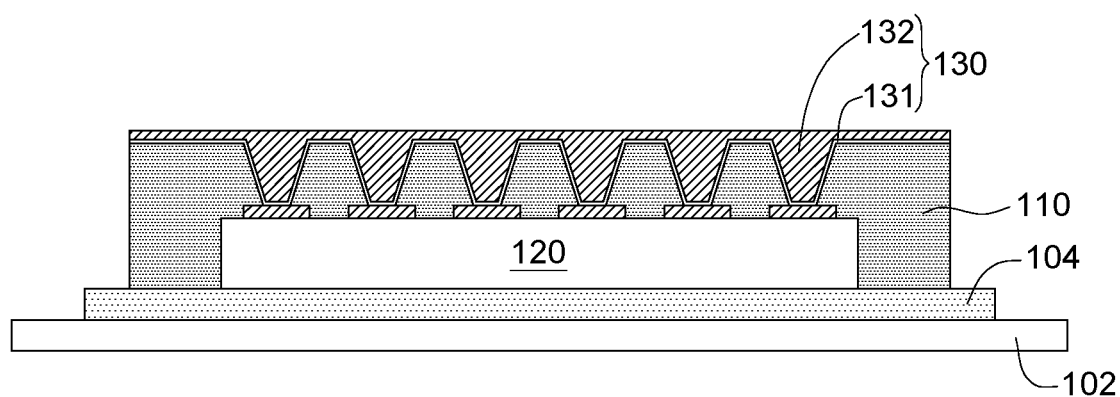
Figure 7G:
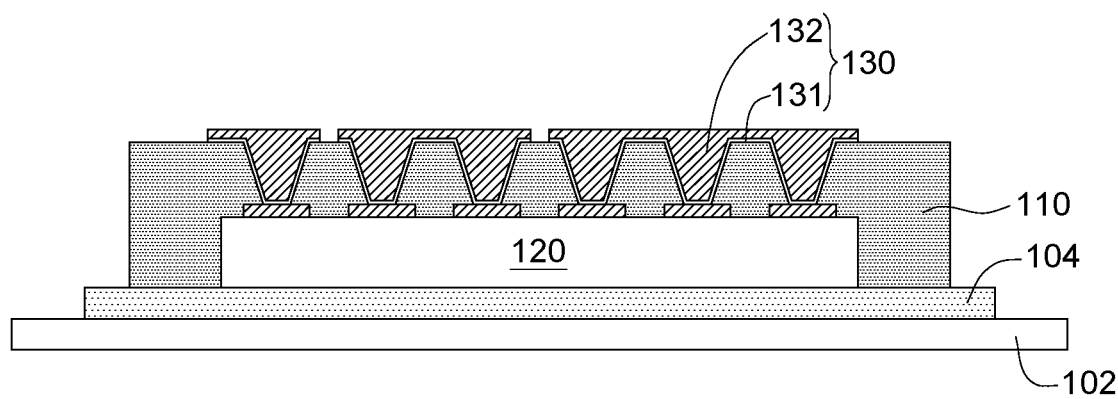
Figure 7H:
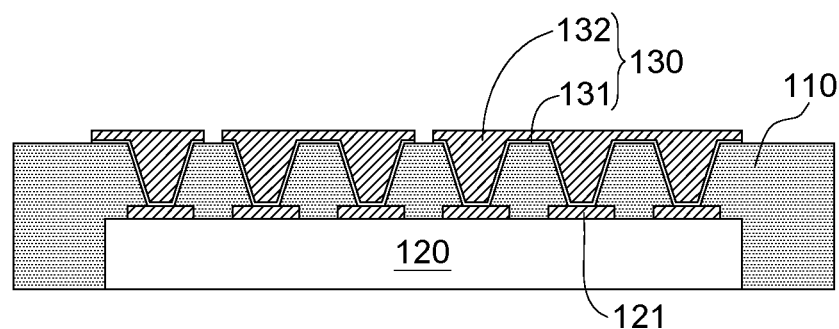
Figure 7I:
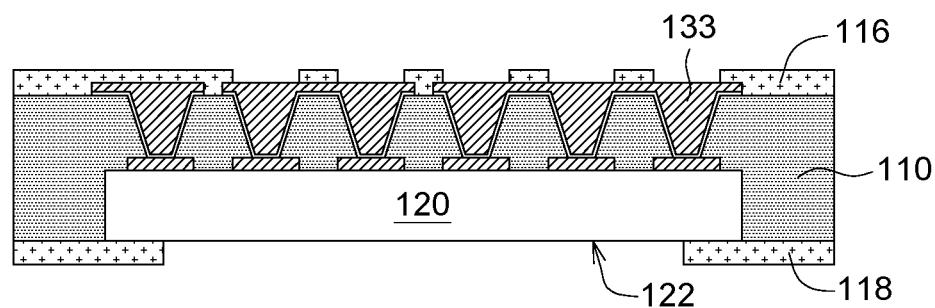

Referring to FIGS. 7A to 7I, which show schematic views of a method of manufacturing an embedded component package structure according to an embodiment of the present invention. First, in the FIGS. 7A and 7B, a release film 104 is formed on the carrier 102. The semiconductor chip 120 is disposed on the release film 104 such that the semiconductor chip 120 is temporarily disposed on the carrier 102. The carrier 102 is, for example, a rigid substrate (such as a metal plate or a plastic plate). The release film 104 is adhered and bonded to the semiconductor chip 120 to position the semiconductor chip 120. In FIG. 7C, a dielectric structure 110 is provided on the carrier 102 to encapsulate the semiconductor chip 120, and the dielectric structure 110 is thermoformed in a mold. That is, the dielectric structure 110 is a thermosetting molding compound material, which is different from the material and thickness of the conventional resin sheet, such as the weight percentage of the fillers and the average size of the fillers. In addition, compared with the conventional method, the semiconductor chip 120 does not need to be fixed on the carrier 102 with a resin sheet, but only with the removable release film 104 to simplify the process and save cost. In FIG. 7D, a patterned sandblast resistant photoresist 106 is formed on the dielectric structure 110. In FIG. 7E, a portion of the upper surface 112 of the dielectric structure 110 is dry sandblasted to form first openings 111 recessed in the dielectric structure 110, and the first opening 111 exposes the electrical pads 121 of the semiconductor chip 120. Next, in the FIGS. 7F and 7G, a patterned conductive layer 130 is formed on the upper surface 112 of the dielectric structure 110 and extends into the first opening 111, and the patterned conductive layer 130 and the electrical pads 121 of the semiconductor chip 120 are electrically connected. The patterned conductive layer 130 includes, for example, an electroless plated seed layer 131 and an electroplated copper layer 132. The electroplated copper layer 132 may be formed on the electroless plated seed layer 131 and portions of the copper layer 132 and the seed layer 131 are etched to form the conductive layer 130. In FIG. 7H, the carrier 102 and the release film 104 are removed. In FIG. 7I, two solder mask layers 116 and 118 are formed on the upper surface 112 and the lower surface 114 of the dielectric structure 110, and the back surface 122 of the semiconductor chip 120 and the bonding pads 133 of the patterned conductive layer 130 are exposed.

Figure 8A:
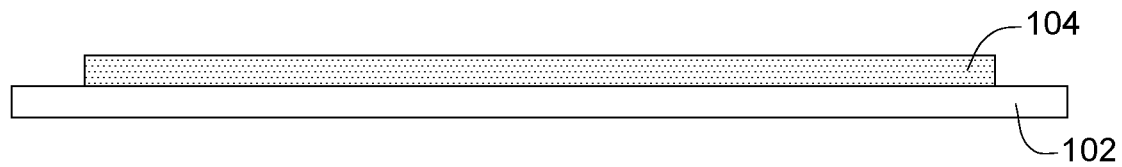
FIGS. 8A to 8L are schematic views showing a method of manufacturing an embedded component package structure according to another embodiment of the present invention.
Figure 8B:
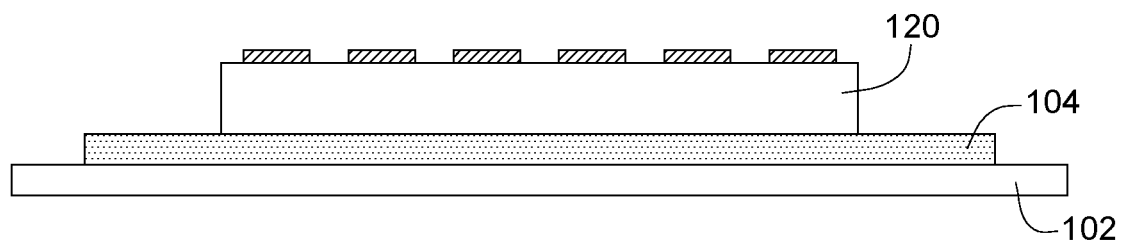
Figure 8C:
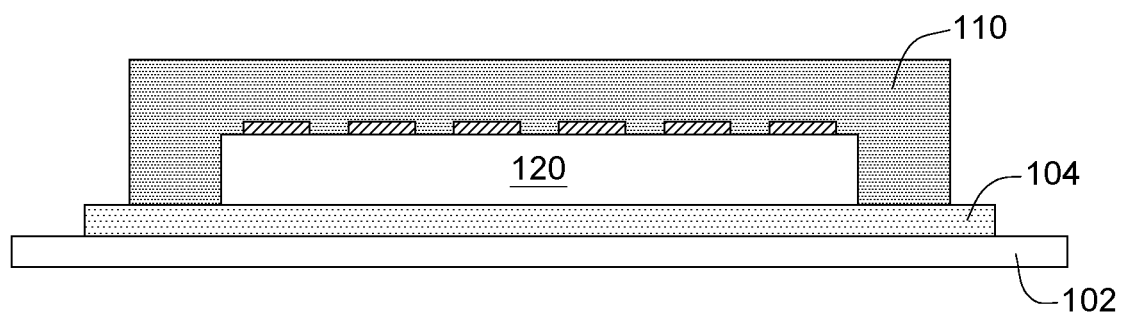
Figure 8D:
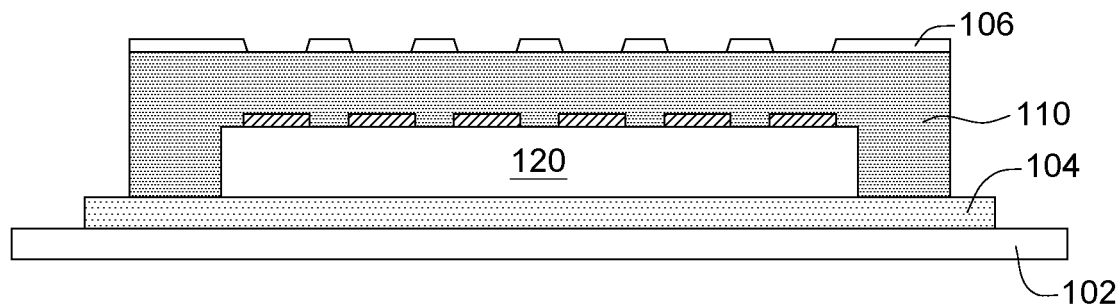
Figure 8E:
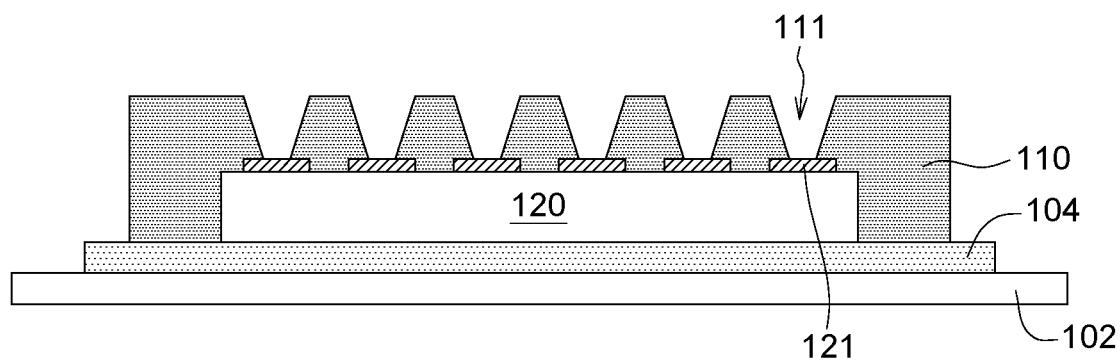
Figure 8F:
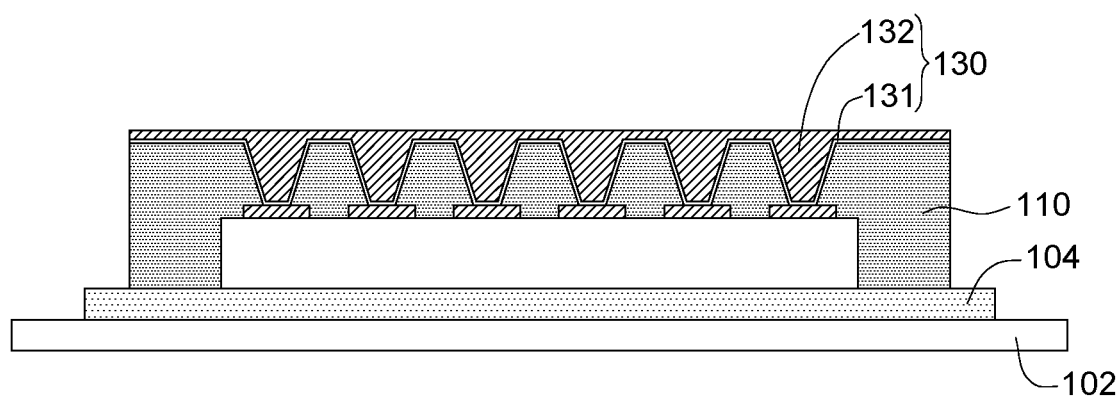
Figure 8G:
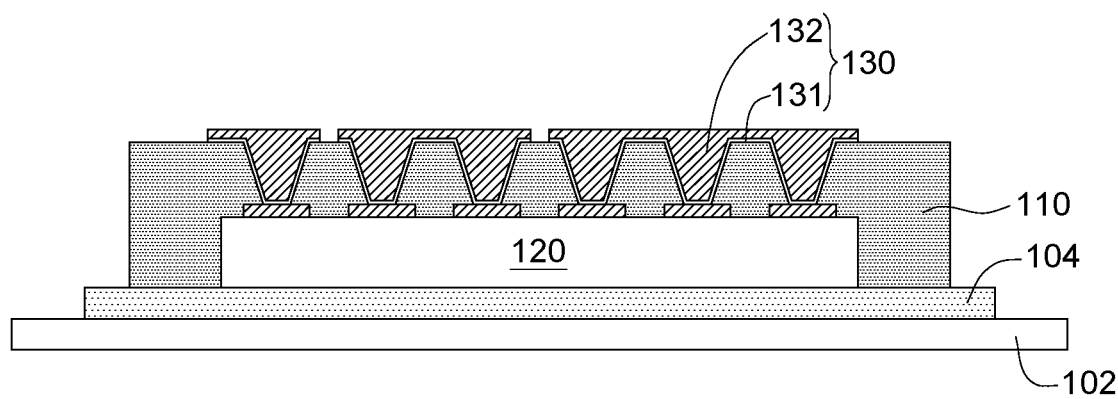
Figure 8H:
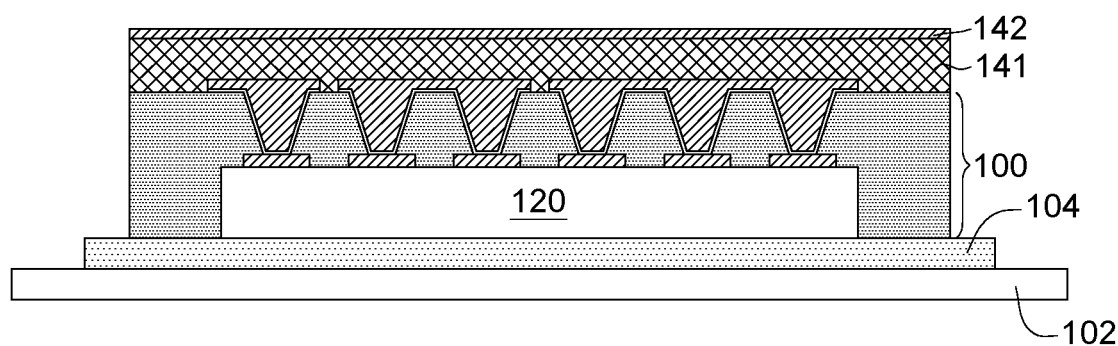
Figure 8I:
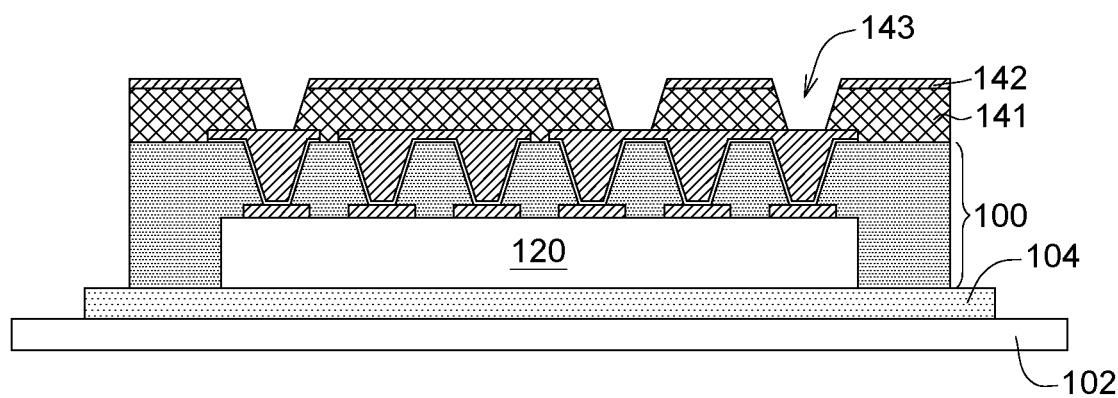
Figure 8J:
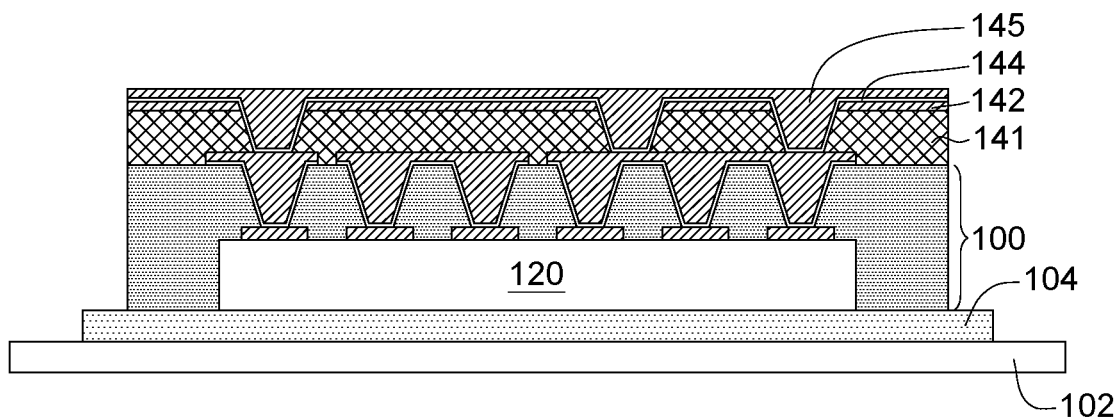
Figure 8K:
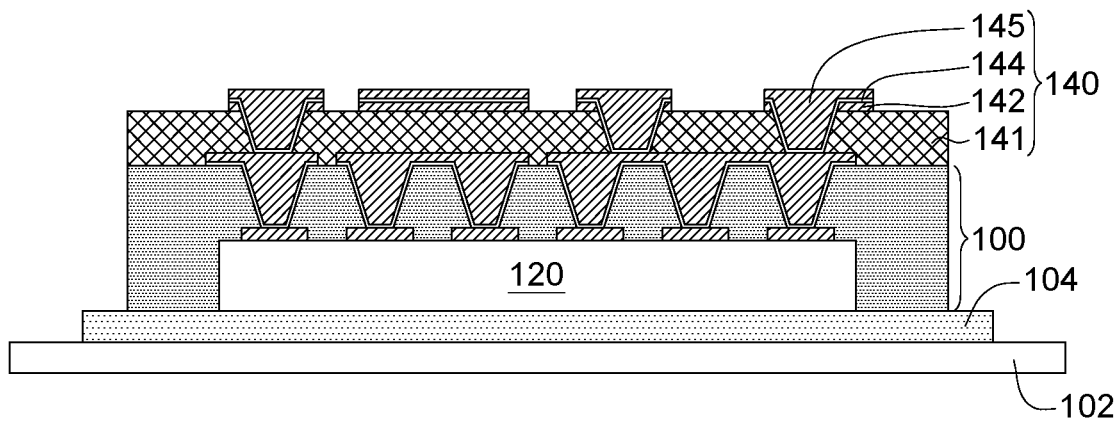
Figure 8L:
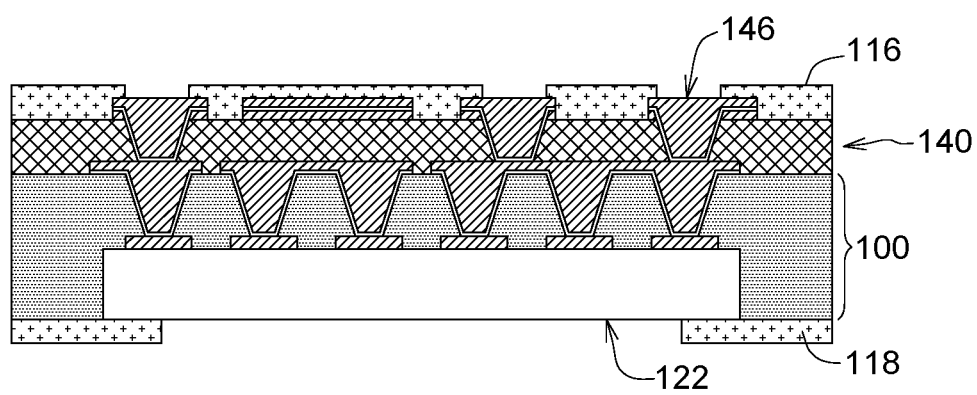

Referring to FIGS. 8A-8L, which show schematic views of a method of manufacturing the embedded component package structure according to another embodiment of the present invention. The steps of FIGS. 8A to 8G have been mentioned in the above embodiments, and are not described herein again. In FIG. 8H, a dielectric layer 141 is formed on the dielectric structure 110, and an upper conductive layer 142 (e.g., a copper foil) is laminated on the dielectric layer 141, and the dielectric layer 141 is cured by heating. The dielectric layer 141 is made of, for example, ABF (Ajinomoto build-up film), pre-impregnated composite fibers, polyimide or polypropylene. In FIG. 8I, a plurality of openings 143 are formed in the dielectric layer 141. Then, in FIG. 8J, an electroless plated seed layer 144 is formed on the upper surface of the upper conductive layer 142 and the openings 143 and an electroplated copper layer 145 is formed on the seed layer 144 to electrically connect the upper conductive layer 142 and the patterned conductive layer 130. In FIG. 8K, the upper conductive layer 142, the seed layer 144, and the electroplated copper layer 145 are etched to form a patterned circuit, and thus, the first circuit structure 140 is completed. In FIG. 8L, two solder mask layers 116 and 118 are formed on the top and bottom of the dielectric structure 110 and the first circuit structure 140, and the back surface 122 of the semiconductor chip 120 and the bonding pads 146 of the first circuit structure 140 are exposed.

Figure 9A:
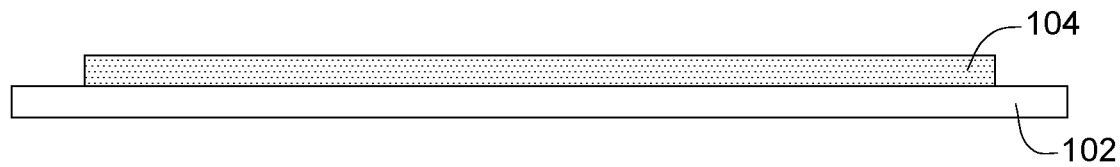
FIGS. 9A to 9L are schematic views showing a method of manufacturing an embedded component package structure according to another embodiment of the present invention.
Figure 9B:
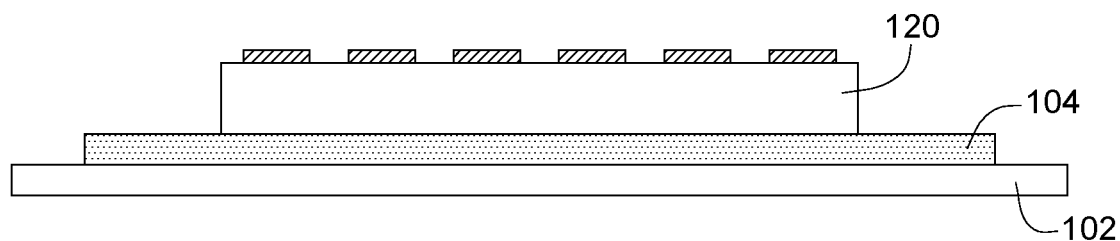
Figure 9C:
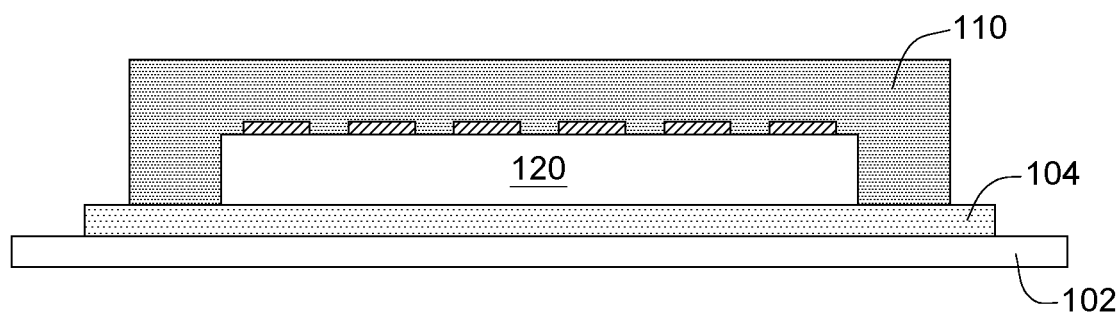
Figure 9D:
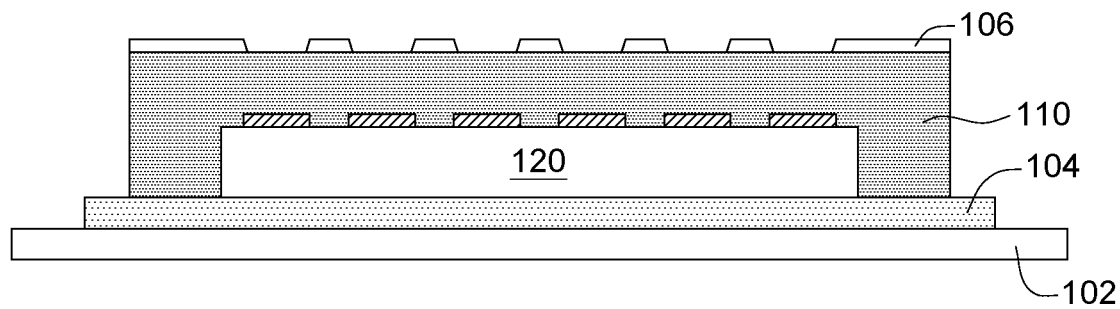
Figure 9E:
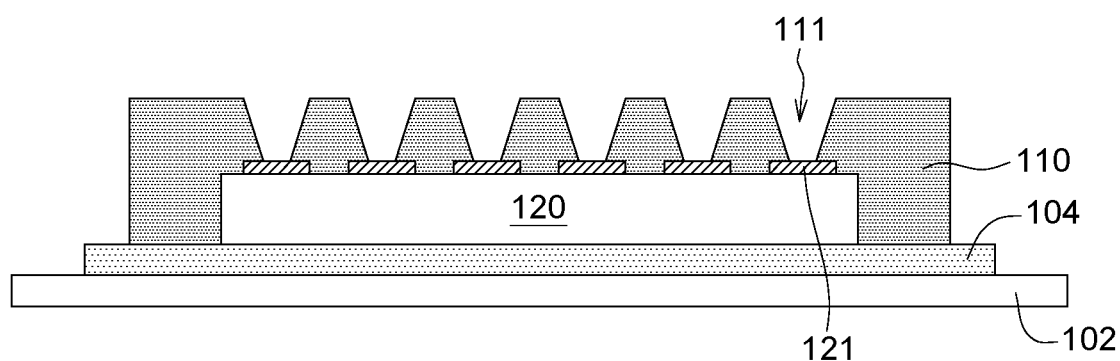
Figure 9F:
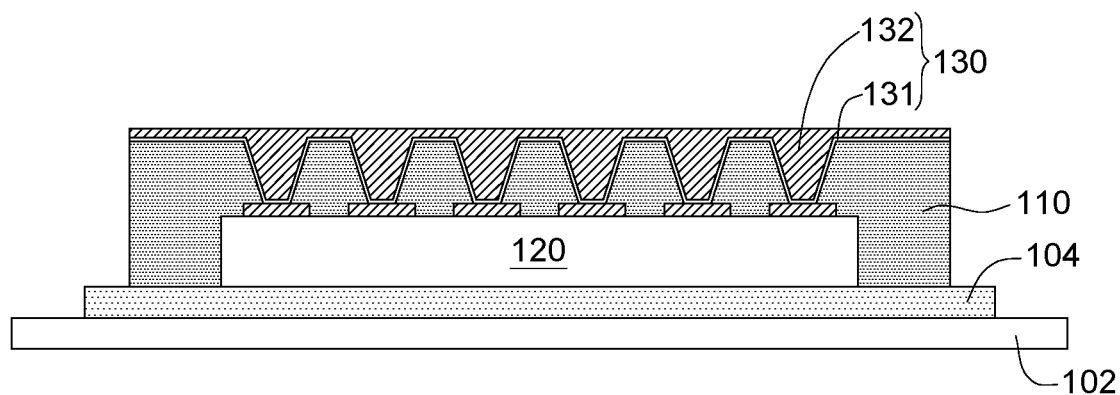
Figure 9G:
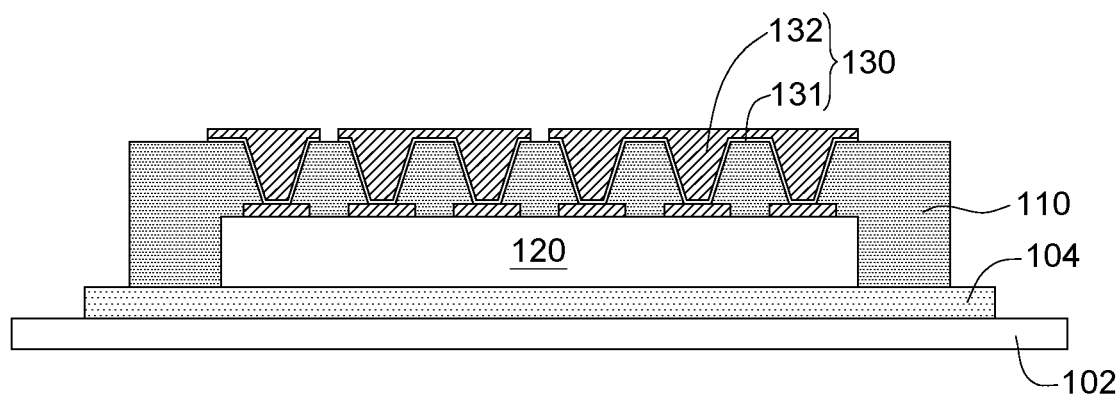
Figure 9H:
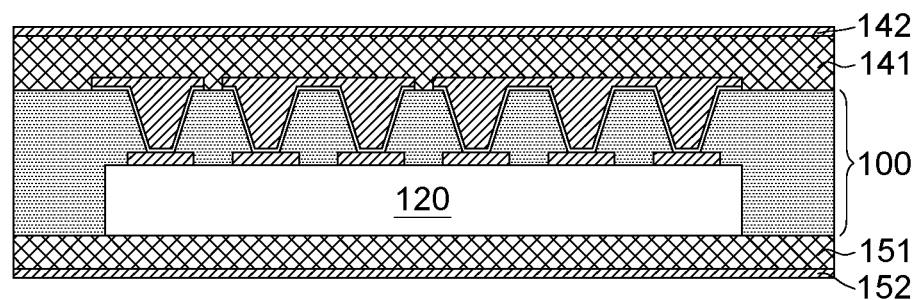
Figure 9I:
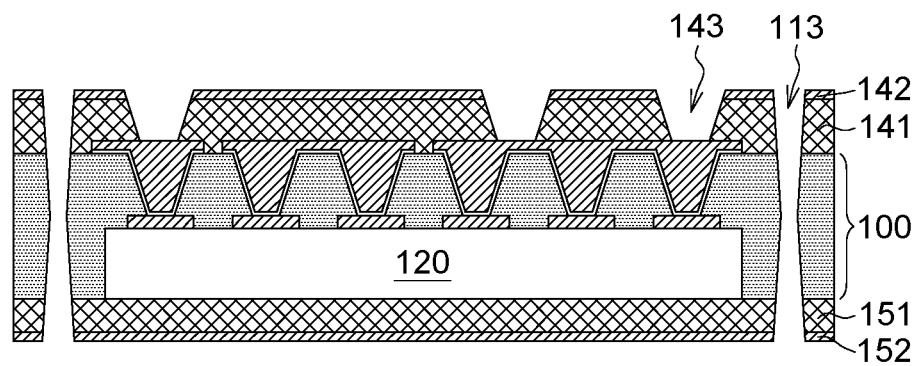
Figure 9J:
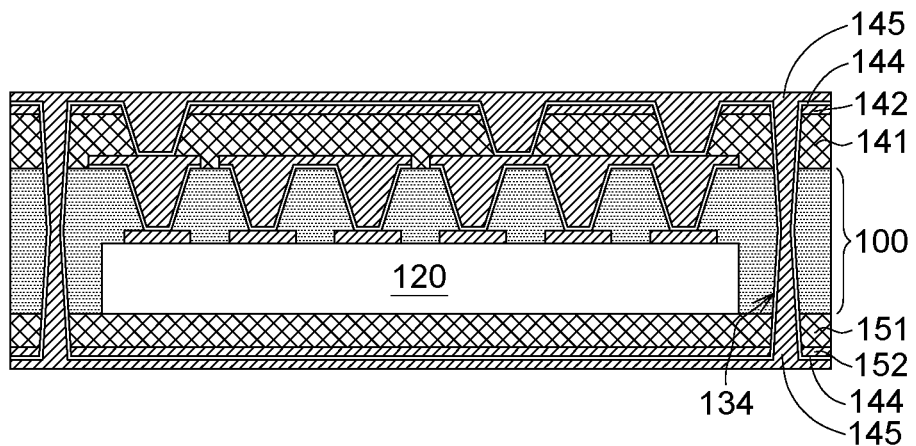
Figure 9K:
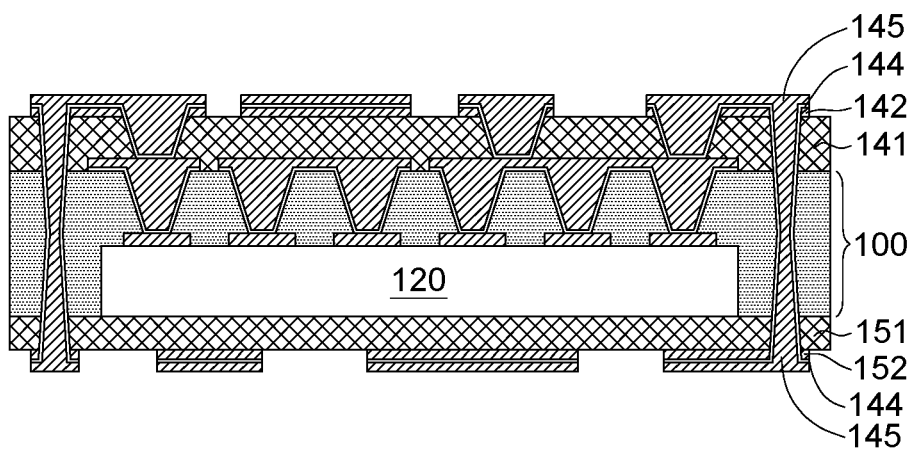
Figure 9L:
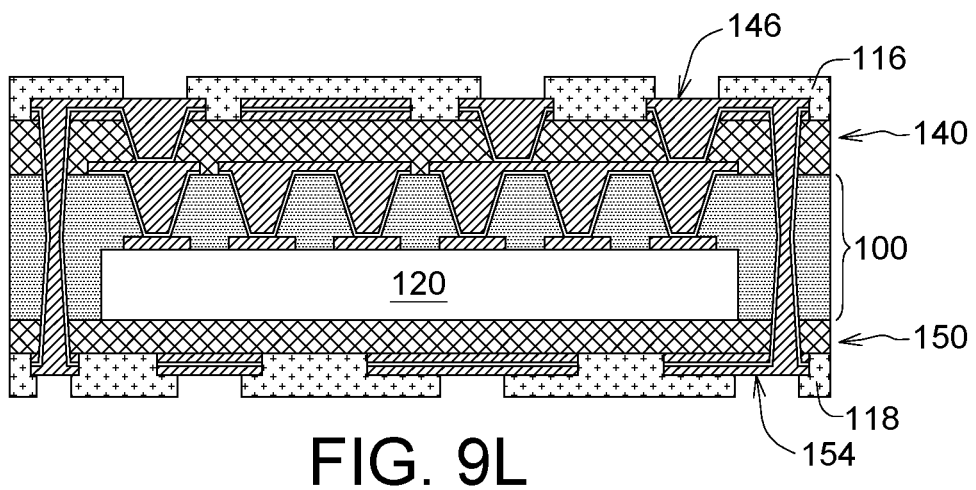

Referring to FIGS. 9A to 9L, which show schematic views of a method of manufacturing an embedded component package structure according to another embodiment of the present invention. The steps of FIGS. 9A to 9G have been mentioned in the above embodiments, and are not described herein again. In FIG. 9H, an upper dielectric layer 141 and a lower dielectric layer 151 are formed on the top and bottom of the dielectric structure 110, and an upper conductive layer 142 and a lower conductive layer 152 (e.g., copper foil) are laminated on the upper dielectric layer 141 and the lower dielectric layer 151, and then the upper dielectric layer 141 and the lower dielectric layer 151 are cured by heating. In FIG. 9I, at least one second opening 113 is formed through the dielectric structure 110, the upper dielectric layer 141, and the lower dielectric layer 151. The method of forming the second opening 113 includes sandblasting. In FIG. 9J, an electroless plated seed layer 144 is formed on the upper conductive layer 142 and the lower conductive layer 152 and in the second opening 113, and an electroplated copper layer 145 is formed on the seed layer 144 so that the upper conductive layer 142 and the lower conductive layer 152 are electrically connected via the conductive post 134 in the second opening 113. In FIG. 9K, the upper conductive layer 142, the seed layer 144, the electroplated copper layer 145, and the lower conductive layer 152 are etched to form a patterned circuit, and thus, the first circuit structure 140 and the second circuit structure 150 are completed. In FIG. 9L, two solder mask layers 116 and 118 are formed on the top and bottom of the first circuit structure 140 and the second circuit structure 150, and the bonding pads 146 of the first circuit structure 140 and bonding pads 154 of the second circuit structure 150 are exposed.

Figure 10A:
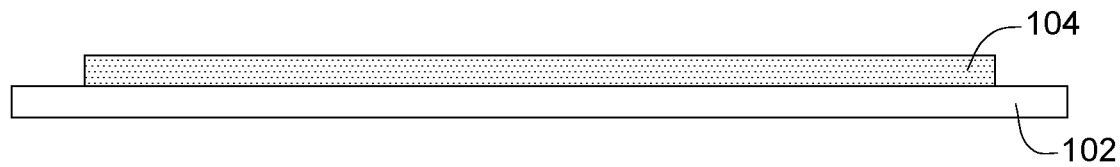
FIGS. 10A to 10L are schematic views showing a method of manufacturing an embedded component package structure according to another embodiment of the present invention.
Figure 10B:
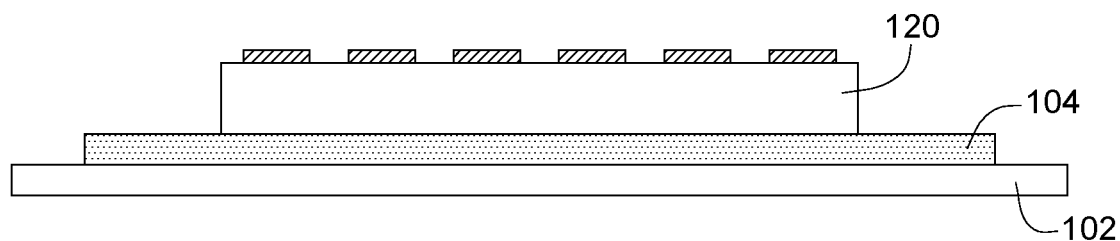
Figure 10C:
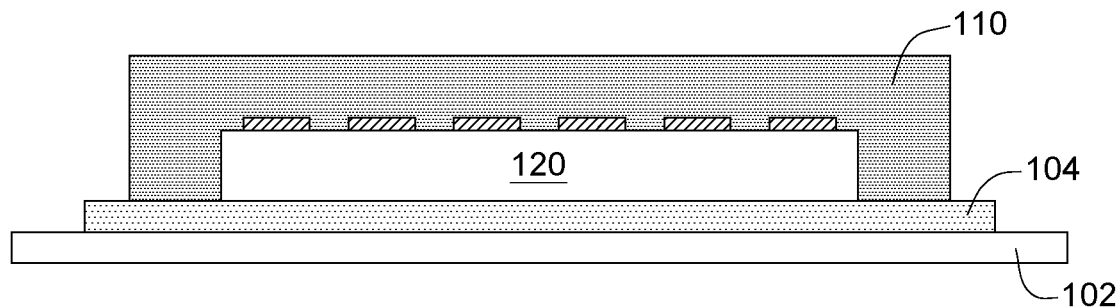
Figure 10D:
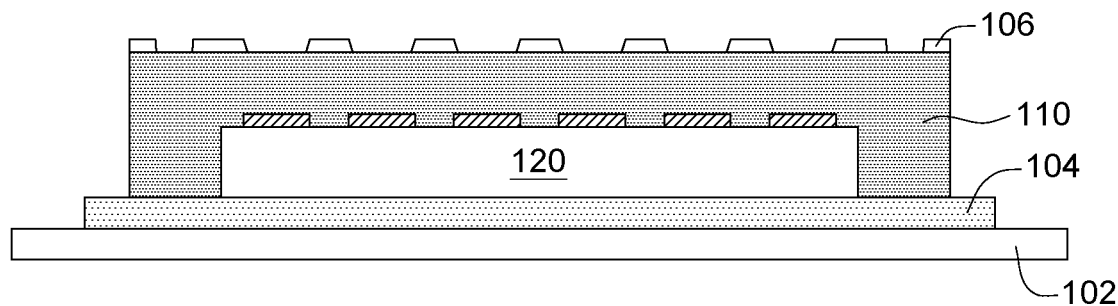
Figure 10E:
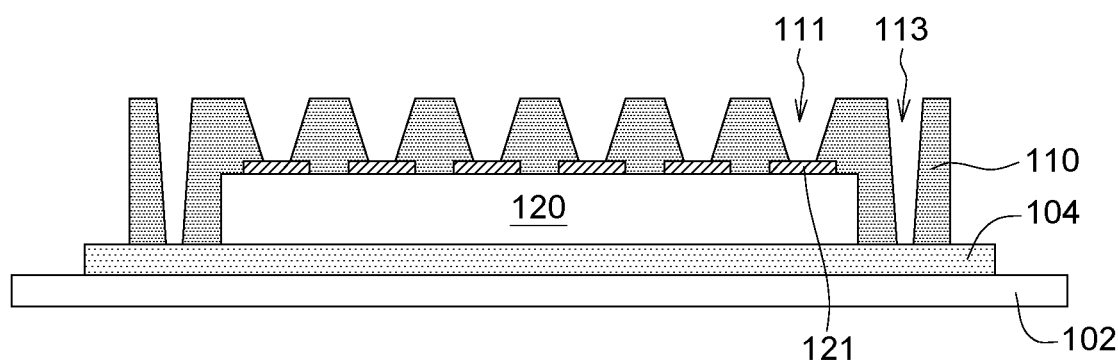
Figure 10F:
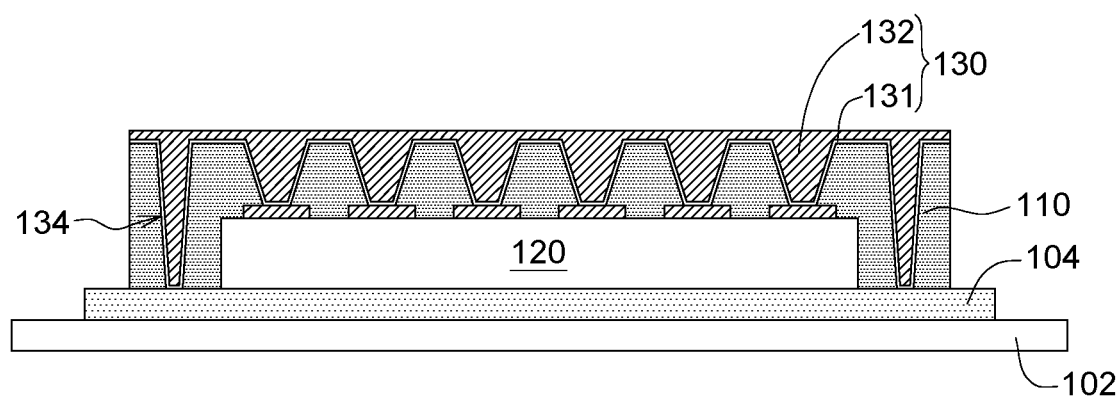
Figure 10G:
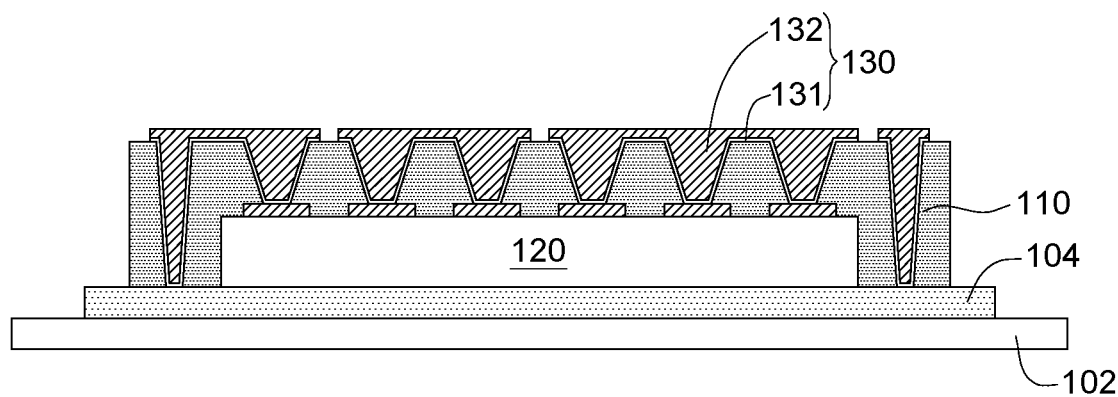
Figure 10H:
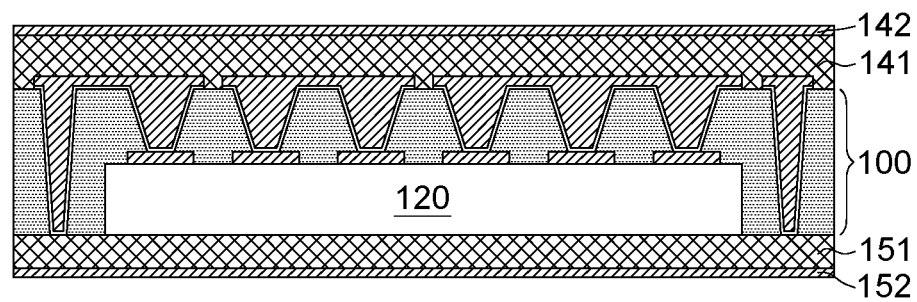
Figure 10I:
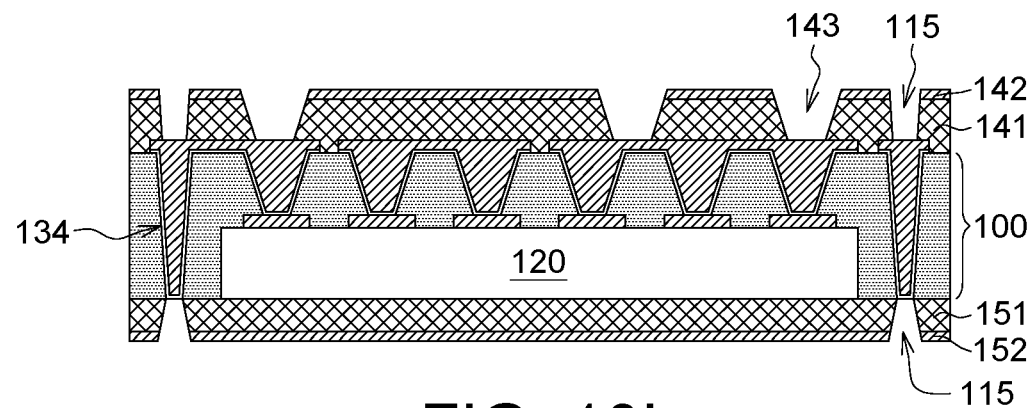
Figure 10J:
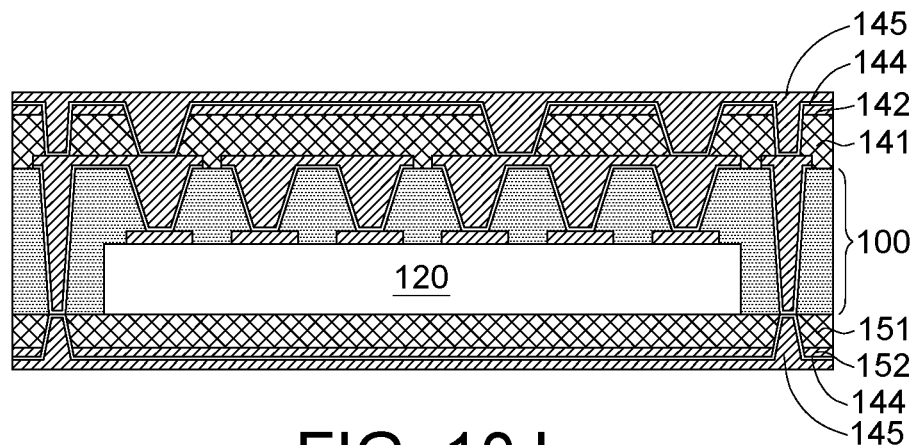
Figure 10K:
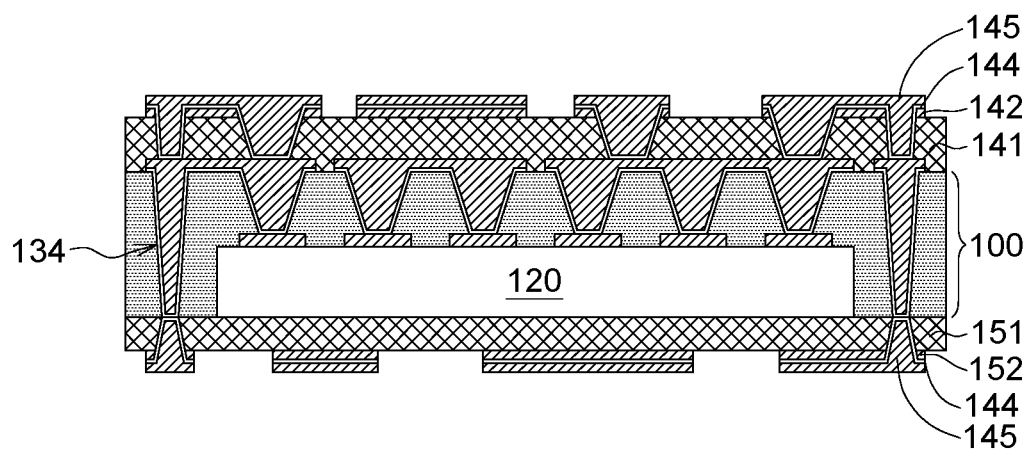
Figure 10L:
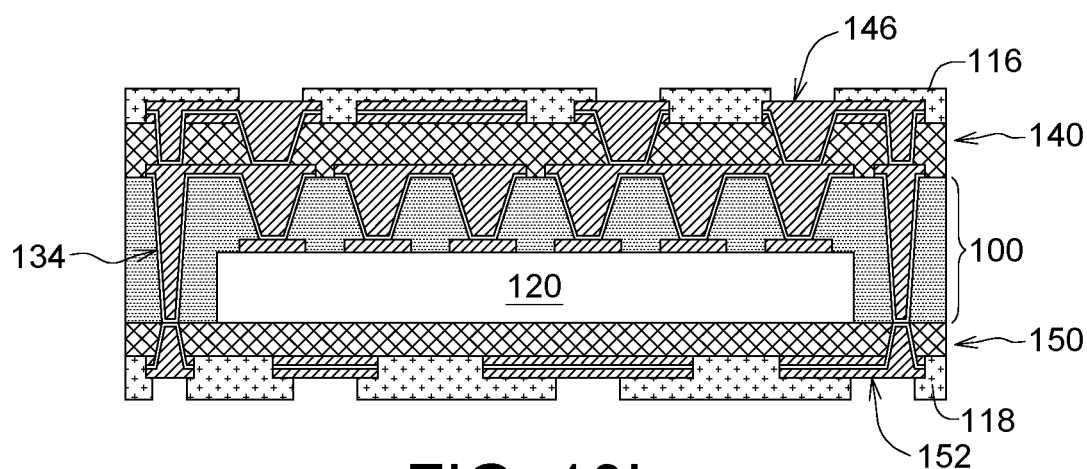

Referring to FIGS. 10A to 10L, which show schematic views of a method of manufacturing an embedded component package structure according to another embodiment of the present invention. The steps of FIGS. 10A to 10G are similar to the steps of FIGS. 9A to 9G, and the same are not described again. The difference is that in FIG. 10E, at least one second opening 113 penetrating through the dielectric structure 110 is further included. Therefore, in the subsequent FIG. 10I, only two blind vias 115 penetrating through the first dielectric layer 141 and the second dielectric layer 151 are formed. The method of forming the second opening 113 and the blind vias 115 includes sandblasting. The steps of FIGS. 10J to 10L are similar to the steps of FIGS. 9J to 9L for forming the first circuit structure 140 and the second circuit structure 150 on the top and bottom of the dielectric structure 110, and the details are not described herein again.

According to the above embodiments of the present invention, since the thickness of the conventional resin sheet is at most 80 μm, a thicker dielectric structure 110 cannot be provided to cover the semiconductor chip 120. In the present embodiment, the conventional resin sheet is replaced with a molding compound material such that the thickness of the dielectric structure 110 can be between 110 and 1420 μm. As long as the thickness of the semiconductor chip 120 is smaller than the thickness of the dielectric structure 110, it is not necessary to thin the chip, and therefore, the problem of warpage due to chip thinning can be solved. Meanwhile, in the fifth generation mobile communication technology (5G), the thickness of the dielectric structure 110 is need to be, for example, 750 μm or more, and the thickness ratio of the dielectric structure 110 to the semiconductor chip 120 is greater than 2 or 3, which can effectively reduce interference of the inductive coupling and improve the electrical insulation of the package structure 100 to meet the needs of the market.

Referring to Table 1, the molding compound 172 of FIG. 6 of the present embodiment is exemplified by a molding compound used in a quad flat package (QFN) structure, for example, which has good hot hardness, low water absorption, low viscosity, low thermal conductivity and high bending strength, suitable for use in component package structures. The material characteristics and parameters of the molding compound 172 are as follows:

TABLE 1

| Grade | KE-G3000 | KE-G3000 | KE-G3000 | KE-G280 | XKE-G7691 |
| --- | --- | --- | --- | --- | --- |
| Type | N-AS | N-AT | N-B | N | |
| Epoxy resin | Hydrophobic + Biphenyl | Hydrophobic + Biphenyl | Hydrophobic + Biphenyl | Hydrophobic + OCN | Hydrophobic + Biphenyl |
| Hardener | Hydrophobic | Hydrophobic | Hydrophobic | Hydrophobic | Hydrophobic |
| Filler content/Shape/ Size | 87% Spherical Ave. size 17 μm/Sieve size 75 μm | 89% Spherical Ave. size 14 μm/Sieve size 55 μm | 89% Spherical Ave. size 14 μm/Sieve size 55 μm | 87% Spherical Ave. size 17 μm/Sieve size 75 μm | 89% Spherical Ave. size 14 μm/Sieve size 55 μm |
| Sulfur free | No | No | No | No | Yes |
| Spiral flow (70 kgf) | 160 cm | 150 cm | 155 cm | 130 cm | 135 cm |
| Gel time | 38 second | 38 second | 38 second | 35 second | 40 second |
| Flow Viscosity (Pa · s) | 5 | 7 | 7 | 7 | 7 |
| C.T.E α1/α2 (ppm/° C.) | α1 (10) α2 (45) | α1 (9) α2 (32) | α1 (9) α2 (32) | α1 (10) α2 (43) | α1 (9) α2 (35) |
| Tg | 125° C. | 135° C. | 135° C. | 135° C. | 120° C. |
| Flexural Strength 25° C. | 180 MPa | 185 MPa | 185 MPa | 175 MPa | 170 MPa |
| Flexural Strength 260° C. | 24 MPa | 25 MPa | 25 MPa | 28 MPa | 24 MPa |
| Flexural Modulus 25° C. | 21 GPa | 22 GPa | 22 GPa | 23 GPa | 20 GPa |
| Flexural Modulus 260° C. | 0.8 GPa | 0.9 GPa | 0.9 GPa | 1.0 GPa | 0.7 GPa |
| Hot Hardness (Barcol) | 85 | 85 | 85 | 85 | 80 |
| Specific Gravity | 1.98 | 2.01 | 2.01 | 1.97 | 2.01 |
| Water Absorption | 0.40% | 0.30% | 0.30% | 0.45% | 0.30% |
| Mold Shrinkage | 0.25% | 0.19% | 0.13% | 0.27% | 0.21% |
| Volume Resistivity 150° C. (ohm · cm) | 5.0E+12 | 5.0E+12 | 5.0E+12 | 5.0E+12 | 5.0E+12 |
| Thermal Conductivity (W/m · K) | 0.9 | 0.9 | 0.9 | 0.9 | 0.9 |
| Flammability (UL94) | V-0 | V-0 | V-0 | V-0 | V-0 equivalent |

Referring to Table 2, the dielectric structure 110 of the present embodiment is exemplified by a molding compound material used in a flip chip BGA (Ball Grid Array) package structure, which also has good hot hardness, low water absorption, low viscosity, low thermal conductivity and has a higher filler content and thus has a higher bending strength than that of conventional resin sheet, suitable for use in embedded component package structures. The material characteristics and parameters of the molding compound of the dielectric structure 110 are as follows:

TABLE 2

| Grade | KE-G1250HT-FC |
|---|---|
| Feature | For flip chip BGA, filler sieving point 25 μm |
| Filler type | $Al_2O_3/SiO_2$ |
| Filler Content | 89 wt % |
| Filler Sieving size | 25 μm |
| Average Filler size | 5 μm |
| Thermal Conductivity (W/m · K) | 3 |
| Spiral Flow (175° C./70 kgf) | 150 cm |
| Gel Time | 38 秒 |
| Flow Viscosity (Pa · s) | 5 |
| C.T.E. α1/α2 (ppm/° C.) | α1 (12) |
|  | α2 (46) |
| Tg | 145° C. |
| Mold Shrinkage % | 0.32 |
| Specific Gravity | — |
| Ionic Impurity Cl$^-$ | 10 ppm |
| Ionic Impurity Na$^+$ | 10 ppm |
| pH | 6 |
| Ec | 3.0 mS/m |

In one embodiment, fillers (e.g., $Al_2O_3/SiO_2$) having small particle size may be selected and added to the dielectric structure 110, such as a particle size of between 5 and 15 μm, preferably between 5 and 10 μm. The weight percentage of the fillers is, for example, 89%. The higher the content of fillers, the higher the coefficient of thermal expansion of the dielectric structure 110 to match the coefficient of thermal expansion of the semiconductor chip 120. In addition, when the the particle size of the fillers is smaller, for the subsequent sandblasting process, the surface roughness of the wall is not excessively large due to large particle size of filler, which affects the bonding reliability of the subsequent electroless plated seed layer to the molding compound material.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded component package structure, comprising:
   a dielectric structure;
   a semiconductor chip embedded in the dielectric structure, the dielectric structure encapsulating the semiconductor chip;
   a patterned conductive layer covering an upper surface of the dielectric structure and extending into a first opening of the dielectric structure, the first opening exposing an electrical pad of the semiconductor chip, and the patterned conductive layer being electrically connected to the electrical pad of the semiconductor chip; and
   a first circuit structure and a second circuit structure, wherein the first circuit structure and the second circuit structure are respectively disposed on the upper surface and a lower surface of the dielectric structure.

2. The package structure of claim 1, wherein the dielectric structure has a first thickness, the semiconductor chip has a second thickness, the first thickness is greater than the second thickness, and a ratio of the first thickness to the second thickness is between 1.1 and 28.4.

3. The package structure of claim 2, wherein the first thickness is between 110 and 1420 μm, and the second thickness is between 50 and 100 μm.

4. The package structure of claim 1, wherein a portion of the upper surface of the dielectric structure is dry sand-blasted to form the first opening recessed into the dielectric structure.

5. The package structure of claim 1, wherein the lower surface of the dielectric structure is aligned with a back surface of the semiconductor chip and the back surface of the semiconductor chip is exposed from the dielectric structure.

6. The package structure of claim 1, wherein the first circuit structure comprises a dielectric layer, the dielectric layer is made of Ajinomoto build-up film (ABF), pre-impregnated composite fibers, polyimide or polypropylene.

7. The package structure of claim 1, further comprising at least one conductive post penetrating the dielectric structure and electrically connected to the first circuit structure and the second circuit structure.

8. The package structure of claim 1, wherein the dielectric structure is a molding compound containing epoxy resin and fillers, a weight percentage of the fillers of the molding compound is more than 85 wt %, and an average size of the fillers is between 5 and 10 μm.

9. The package structure of claim 1, wherein the semiconductor chip further comprises a die attach film (DAF) and a circuit layer embedded in the die attach film.

10. The package structure of claim 1, further comprises a component disposed on the first circuit structure and a mold compound encapsulating the component on the package structure.

11. The package structure of claim 1, wherein the first circuit structure comprises a dielectric layer covering a portion of the upper surface of the dielectric structure.

12. The package structure of claim 1, wherein the second circuit structure comprises a dielectric layer contacting a back surface of the semiconductor chip.

13. An embedded component package structure, comprising:
   a dielectric structure;
   a semiconductor chip embedded in the dielectric structure, the dielectric structure encapsulating the semiconductor chip, and a lower surface of the dielectric structure is aligned with a back surface of the semiconductor chip and the back surface of the semiconductor chip is exposed from the dielectric structure;
   a patterned conductive layer covering an upper surface of the dielectric structure and extending into a first opening of the dielectric structure, the first opening exposing an electrical pad of the semiconductor chip, and the patterned conductive layer being electrically connected to the electrical pad of the semiconductor chip; and a heat sink layer disposed on the lower surface of the dielectric structure and thermally contacting the back surface of the semiconductor chip.

14. A buried component package structure, comprising:

a dielectric structure;

a semiconductor chip embedded in the dielectric structure, the dielectric structure encapsulating the semiconductor chip; and a patterned conductive layer covering an upper surface of the dielectric structure and extending into a first opening of the dielectric structure, the first opening exposing an electrical pad of the semiconductor chip, and the patterned conductive layer being electrically connected to the electrical pad of the semiconductor chip; and a first circuit structure disposed on the upper surface of the dielectric structure, and the first circuit structure comprises a dielectric layer, the dielectric layer is made of Ajinomoto build-up film (ABF), pre-impregnated composite fibers, polyimide or polypropylene.

15. The package structure of claim 14, wherein the dielectric structure has a first thickness, the semiconductor chip has a second thickness, the first thickness is greater than the second thickness, and a ratio of the first thickness to the second thickness is between 1.1 and 28.4.

16. The package structure of claim 14, wherein a portion of the upper surface of the dielectric structure is dry sandblasted to form the first opening recessed into the dielectric structure.

17. The package structure of claim 14, wherein a lower surface of the dielectric structure is aligned with a back surface of the semiconductor chip and the back surface of the semiconductor chip is exposed from the dielectric structure.

18. The package structure of claim 14, wherein the dielectric structure is a thermosetting molding compound.

19. The package structure of claim 14, further comprising a second circuit structure, wherein the second circuit structure is disposed on a lower surface of the dielectric structure.

20. The package structure of claim 19, further comprising at least one conductive post penetrating the dielectric structure and electrically connected to the first circuit structure and the second circuit structure.

21. The package structure of claim 14, further comprising a solder mask layer disposed on a lower surface of the dielectric structure and exposing a back surface of the semiconductor chip.

* * * * *